(12) United States Patent
Fan et al.

(10) Patent No.: US 10,298,254 B1
(45) Date of Patent: May 21, 2019

(54) METHOD OF ARRANGING CAPACITOR ARRAY OF SUCCESSIVE APPROXIMATION REGISTER ANALOG-TO-DIGITAL CONVERTER

(71) Applicant: UNIVERSITY OF ELECTRONIC SCIENCE AND TECHNOLOGY OF CHINA, Chengdu (CN)

(72) Inventors: Hua Fan, Chengdu (CN); Jingxuan Yang, Chengdu (CN); Quanyuan Feng, Chengdu (CN); Dagang Li, Chengdu (CN); Daqian Hu, Chengdu (CN); Yuanjun Cen, Chengdu (CN); Hadi Heidari, Chengdu (CN); Franco Maloberti, Chengdu (CN); Jingtao Li, Chengdu (CN); Huaying Su, Chengdu (CN)

(73) Assignee: UNIVERSITY OF ELECTRONIC SCIENCE AND TECHNOLOGY CHINA, Chengdu (CN)

( * ) Notice: Subject to any disclaimer, the term of this patent is extended or adjusted under 35 U.S.C. 154(b) by 0 days.

(21) Appl. No.: 16/114,300

(22) Filed: Aug. 28, 2018

(30) Foreign Application Priority Data

Oct. 31, 2017 (CN) .......................... 2017 1 1039954

(51) Int. Cl.
 *H03M 1/46* (2006.01)
(52) U.S. Cl.
 CPC ........... *H03M 1/468* (2013.01); *H03M 1/462* (2013.01)

(58) Field of Classification Search
 CPC .............................. H03M 1/462; H03M 1/468
 USPC .................................................. 341/144–172
 See application file for complete search history.

(56) References Cited

U.S. PATENT DOCUMENTS

| | | | | |
|---|---|---|---|---|
| 5,057,838 A * | 10/1991 | Tsuji | ................... | H03M 1/0651 341/133 |
| 5,420,592 A * | 5/1995 | Johnson | ................... | G01S 11/10 342/357.46 |
| 6,107,950 A * | 8/2000 | Fisher | ................. | H03M 1/1057 327/94 |
| 6,236,346 B1 * | 5/2001 | Schofield | ............ | H03M 1/0648 341/144 |
| 7,825,838 B1 * | 11/2010 | Srinivas | .............. | H03M 1/1014 341/120 |
| 8,456,342 B2 * | 6/2013 | Wu | ...................... | H03M 1/0648 341/120 |
| 2002/0080054 A1 * | 6/2002 | Harada | ................. | H03M 1/068 341/154 |
| 2002/0118130 A1 * | 8/2002 | Kulkarni | ............. | G06F 17/5068 341/172 |
| 2011/0095824 A1 * | 4/2011 | Bacon | ................. | H01L 27/0207 330/277 |
| 2018/0198457 A1 * | 7/2018 | Fan | ....................... | H03M 1/004 |

* cited by examiner

Primary Examiner — Lam T Mai
(74) Attorney, Agent, or Firm — Matthias Scholl P.C.; Matthias Scholl (57) ABSTRACT

A method of arranging a capacitor array of a successive approximation register analog-to-digital converter in a successive approximation process, the method including: splitting a binary capacitor array into unit capacitors, then sorting, grouping, and rotating the original binary capacitive array involved in successive approximation conversion.

1 Claim, 8 Drawing Sheets

|  | 32C | 16C | 8C 4C 2C C C |
|---|---|---|---|
| Vin(i) | Group1 & Group2 | Group3 | Group4 |
| Vin(i+1) | Group4 & Group1 | Group2 | Group3 |
| Vin(i+2) | Group3 & Group4 | Group1 | Group2 |
| Vin(i+3) | Group2 & Group3 | Group4 | Group1 |
| Vin(i+4) | Group3 & Group4 | Group1 | Group2 |
| Vin(i+5) | Group4 & Group1 | Group2 | Group3 |
| Vin(i+6) | Group1 & Group2 | Group3 | Group4 |
| ⋮ | ⋮ | ⋮ | ⋮ |

METHOD OF ARRANGING CAPACITOR ARRAY OF SUCCESSIVE APPROXIMATION REGISTER ANALOG-TO-DIGITAL CONVERTER

CROSS-REFERENCE TO RELATED APPLICATIONS

Pursuant to 35 U.S.C. § 119 and the Paris Convention Treaty, this application claims foreign priority to Chinese Patent Application No. 201711039954.3 filed Oct. 31, 2017, the contents of which and any intervening amendments thereto are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, and Cambridge, Mass. 02142.

BACKGROUND OF THE INVENTION

Field of the Invention

This disclosure relates to a successive approximation register analog-to-digital converters (SAR ADC), and more particularly to a method of arranging a capacitor array of a successive approximation register analog-to-digital converter in a successive approximation process.

Description of the Related Art

Smart sensors are devices that contain integrated transducers, signal conditioning modules, and processing modules. Smart sensors are applied in such fields as precision instruments, medical instruments, communication, radar, aerospace, electronic countermeasures, security screening systems, fault detection, and earthquake detection. In recent years, with the rapid development of smart sensors, research on embedded modules such as sensors, amplifiers, and analog-to-digital converters (ADCs) for smart sensors has drawn much attention.

Figure 1:
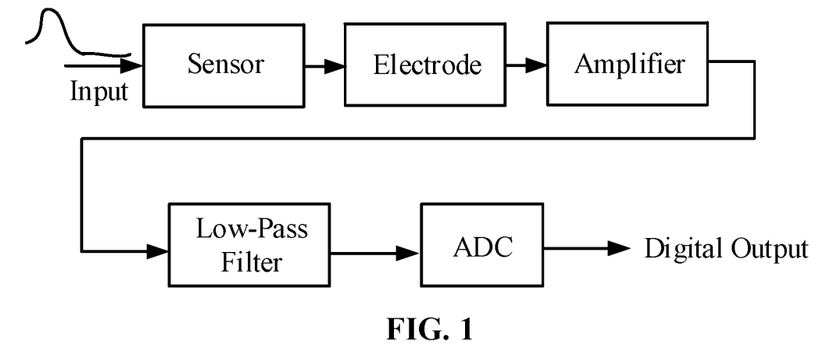
FIG. 1 is basic architectural components of a traditional smart sensor node.

FIG. 1 shows a block diagram of a smart sensor node: the sensor detects a physical, chemical, or biological quantity, then small signal at the output of the sensor is amplified and filtered. Thereafter, an analog-to-digital converter (ADC) converts the analog sensing signal into digital codes. Since the ADC is an important block in a smart sensor node, optimizing the performance of the ADC, specifically optimizing the resolution of the ADC, is important for meeting the demands of multi-functional smart sensor nodes for low power consumption and small silicon area.

The architectures of mainstream Nyquist-Rate ADCs include Flash ADC, successive approximation register (SAR) ADC, pipeline ADC, and Sigma-Delta ADC. Spurious-free dynamic range (SFDR), signal-to-noise and distortion ratio (SNDR), and signal-to-noise ratio (SNR) are dynamic parameters that evaluate the linearity of the ADC. Higher dynamic parameters mean higher linearity.

Figure 2:
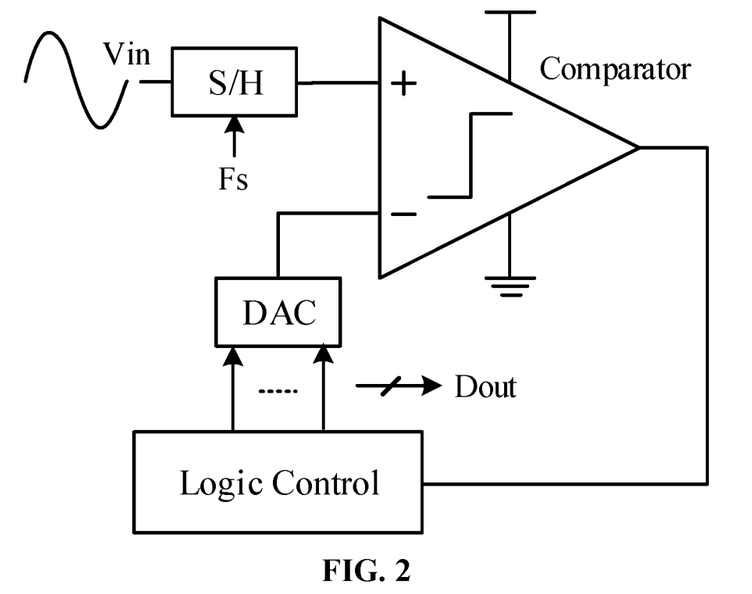
FIG. 2 is a typical architecture of SAR ADC.

Flash ADC can only be used for low resolution and high sampling rate application. Pipeline and Sigma-Delta ADCs are not appropriate for low power consumption design as they require using op-amps. SAR ADC uses a binary algorithm to convert the input analog signal into the output digital signal. As shown in FIG. 2, it consists of a sample-and-hold (S/H) stage, a digital-to-analog converter (DAC), a voltage comparator, and a successive approximation register.

Figure 3:
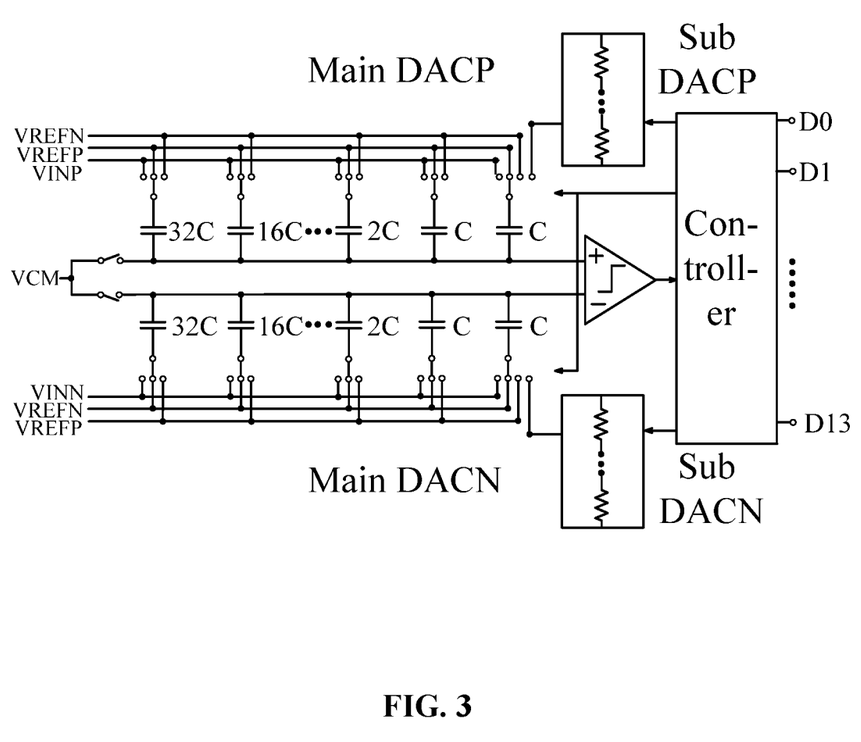
FIG. 3 is a capacitor-resistor combined 14-bit SAR ADC architecture.

The high-resolution SAR ADC mainly adopts a combined capacitor-resistor network, as shown in FIG. 3. In the combined capacitor-resistor network, resistors and capacitors are both used. The most significant bits (MSBs) of DAC are formed by the binary capacitive array, while the least significant bits (LSBs) of DAC are formed by the resistor string. Therefore, the total capacitance of the combined capacitor-resistor structure becomes smaller than that of a binary structure, which effectively reduces the area of the capacitive array. In particular, the smaller the area, the faster the ADC.

As shown in FIG. 3, the capacitor mismatch limits the performance of the converter. The calibration method can improve SFDR by swapping a MSB capacitor and the rest of the capacitors, but the performance improvement is limited. Traditional foreground calibration and background calibration techniques increase the chip area. The capacitor re-configuring technique can significantly improve the SFDR, however, additional 64 unit capacitors are needed, which greatly increases the chip area.

SUMMARY OF THE INVENTION

In view of the above-described problems, it is an objective of the invention to a method of arranging a capacitor array of a successive approximation register analog-to-digital converter that can reduce unnecessary losses such as design complexity, chip area, power consumption, and speed of a SAR ADC. Another objective of the invention is to reduce the capacitor mismatch of a SAR ADC without using additional capacitors.

To achieve the above objective, according to one aspect of the invention, there is provided a method of arranging a capacitor array of a successive approximation register analog-to-digital converter in a successive approximation process, the method comprising:

Step 1: separating a 6-bit binary capacitive DAC of 64 unit capacitors (64 C) into 64 independent capacitors;

Step 2: sorting the 64 independent capacitors from highest to lowest by capacitance, then using 64 digital codes from C1 to C64 to numbering the 64 independent capacitors sorted from highest to lowest by capacitance, and then recording the 64 digital codes and corresponding capacitance values of the 64 independent capacitors in a register;

Step 3: dividing the 64 independent capacitors into four groups as follows:

Group 1 comprising C1, C64, C3, C62, C5, C60, C7, C58, C9, C56, C11, C54, C13, C52, C15, and C50;

Group 2 comprising C17, C48, C19, C46, C21, C44, C23, C42, C25, C40, C27, C38, C29, C36, C31, and C34;

Group 3 comprising C32, C33, C30, C35, C28, C37, C26, C39, C24, C41, C22, C43, C20, C45, C18, and C47; and Group 4 comprising C16, C49, C14, C51, C12, C53, C10, C55, C8, C57, C6, C59, C4, C61, C2, and C63; and Step 4: in a successive approximation conversion process, selecting two groups to constitute a largest capacitor 32C, select one group from the remaining two groups to constitute a second largest capacitor 16C, selecting first 8 capacitors in the last group to constitute a capacitor 8C, selecting the next 9th-12th capacitors in the last group to constitute a capacitor 4C, selecting the 13th and 14th capacitors in the last group to constitute a capacitor 2C, and selecting the last two capacitors to constitute two capacitors C and C, respectively.

In a class of this embodiment, step 4 is carried out as follows:

in a first successive approximation conversion process, Group 1 and Group 2 are selected to constitute the largest capacitor 32C, Group 3 is selected to constitute the second largest capacitor 16C, Group 4 is selected to constitute capacitors 8C, 4C, 2C, C, and C;

in a second successive approximation conversion process, Group 4 and Group 1 are selected to replace the largest capacitor 32C, Group 2 is selected to replace the second largest capacitor 16C, Group 3 is selected to replace capacitors 8C, 4C, 2C, C, and C;

in a third successive approximation conversion process, Group 3 and Group 4 are selected to replace the largest capacitor 32C, Group 1 is selected to replace the second largest capacitor 16C, Group 2 is selected to replace capacitors 8C, 4C, 2C, C, and C;

in a fourth successive approximation conversion process, Group 2 and Group 3 are selected to replace the largest capacitor 32C, Group 4 is selected to replace the second largest capacitor 16C, Group 1 is selected to replace capacitors 8C, 4C, 2C, C, and C;

in a fifth successive approximation conversion process, Group 3 and Group 4 are selected to replace the largest capacitor 32C, Group 1 is selected to replace the second largest capacitor 16C, Group 2 is selected to replace capacitors 8C, 4C, 2C, C, and C; and in a sixth successive approximation conversion process, Group 4 and Group 1 are selected to replace the largest capacitor 32C, Group 2 is selected to replace the second largest capacitor 16C, Group 3 is selected to replace capacitors 8C, 4C, 2C, C, and C.

In a class of this embodiment, the above-mentioned six successive approximation conversion processes are repeated in loops.

Advantages of the method according to embodiments of the disclosure are summarized as follows: by sorting, combining, and adjusting the capacitive array, the capacitor mismatch can be reduced. Compared with the conventional methods, the ADC mismatch error is reduced and the accuracy is improved. Compared with the conventional technology, this invention does not require additional capacitors.

DETAILED DESCRIPTION OF THE EMBODIMENTS

The capacitor optimization method of the invention is for enhancing the linearity of capacitor-resistor combined SAR ADC for smart sensor applications. The capacitor optimization method of the invention includes splitting a binary capacitor array into unit capacitors and then sorting and grouping, and finally, according to certain rule, rotating the original binary capacitive array involved in successive approximation conversion. The method of the invention applied to a traditional 14-bit resistor-capacitor successive approximation ADC as shown in FIG. 3 which consists of a 6-bit capacitor DAC and an 8-bit resistor string DAC is described in detail below.

Figure 4A:
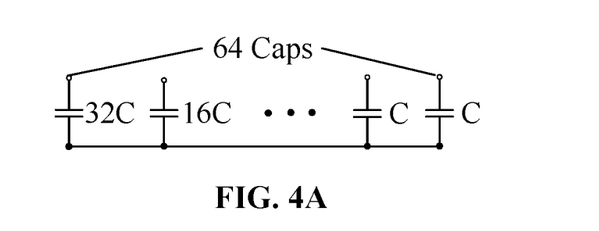
FIG. 4A is a conventional binary capacitive array of the capacitor-resistor combined 14-bit SAR ADC architecture in FIG. 3.
Figure 4B:
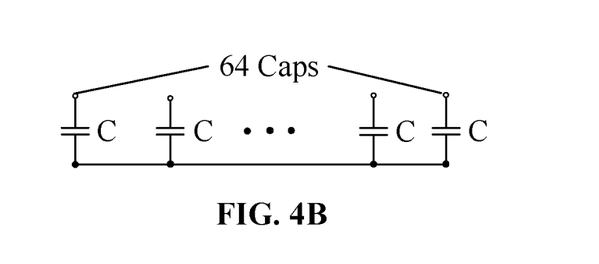
FIG. 4B is a scheme of splitting binary capacitive array into unary architecture.
Figure 4C:
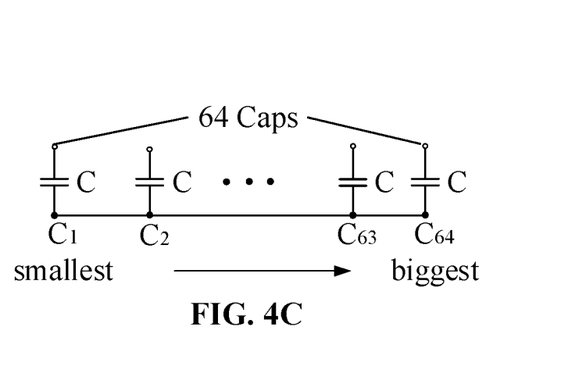
FIG. 4C is a scheme of sorting 64 independent capacitors.
Figure 4D:
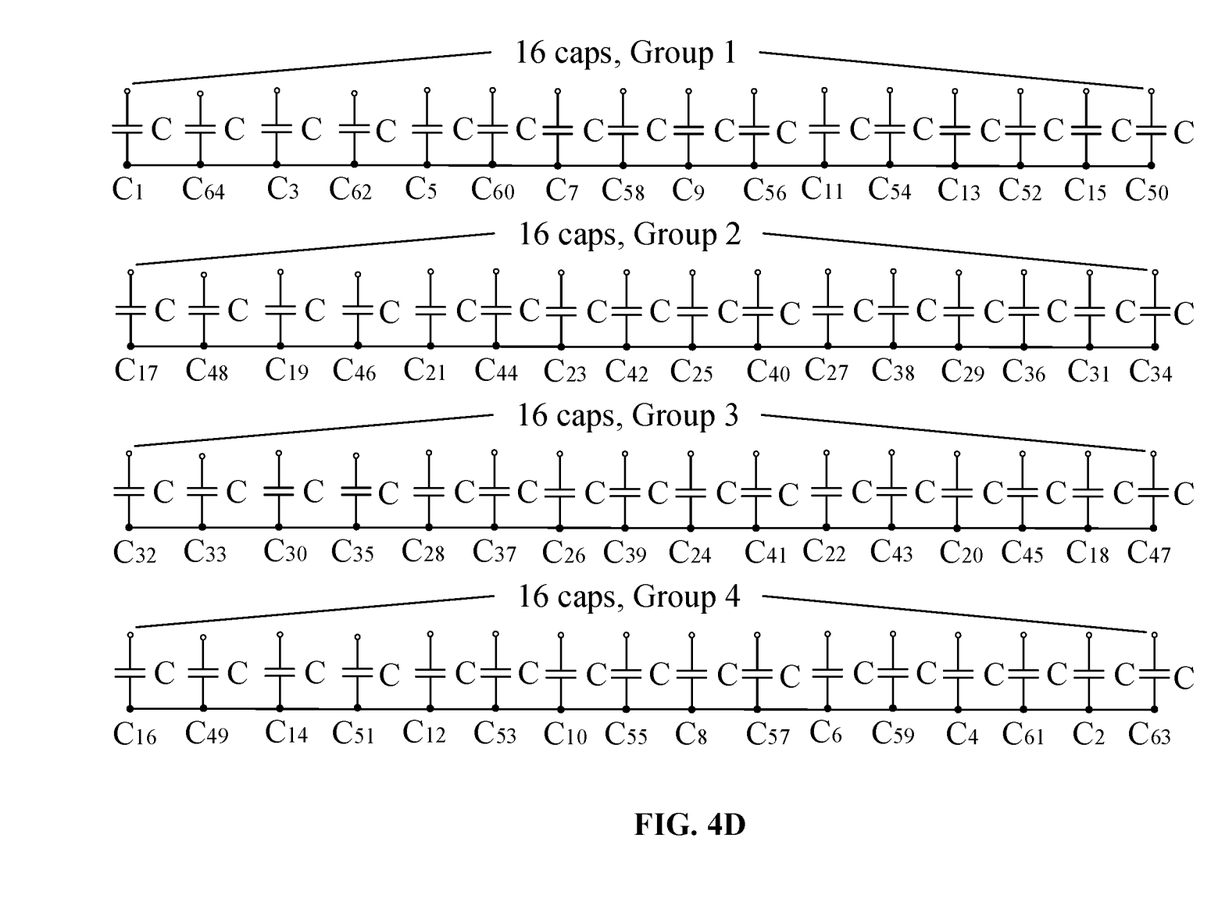
FIG. 4D is a scheme of dividing the 64 independent capacitors into 4 groups.
Figure 5:
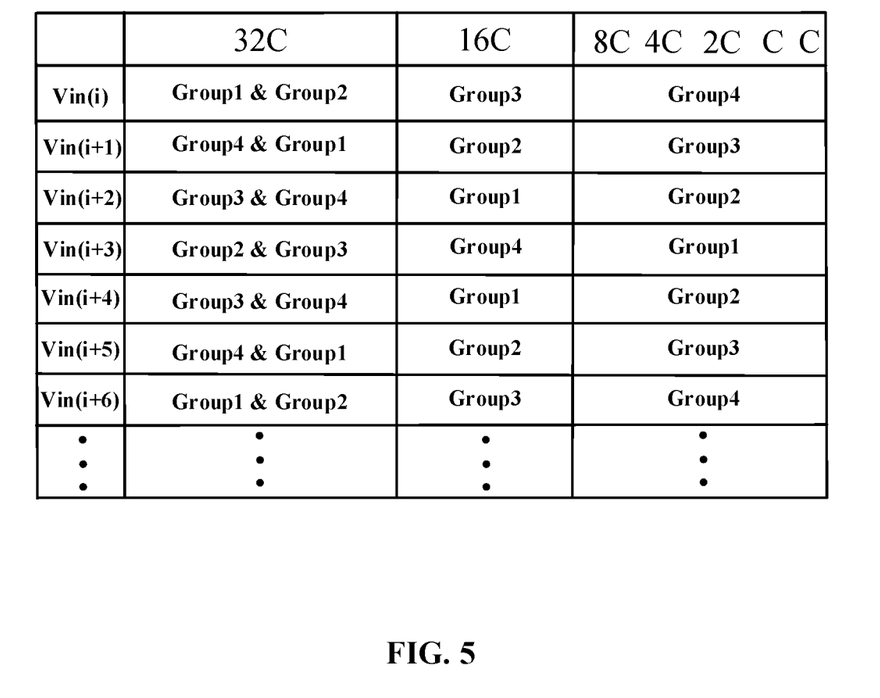
FIG. 5 is a scheme of rotating the 4 groups of capacitors in successive approximation conversion process.

The optimization method proposed in this invention is shown in FIGS. 4A-4B. First, the binary capacitive array is split into unary capacitive array. After powered on, all the unit capacitors are measured and sorted, and digital codes of all capacitors are obtained. Then, grouping is performed according to the rules shown in step 3, and finally, the capacitors are replaced according to the rules during each successive approximation conversion according to the strategy shown in FIG. 5. For example, for the i-th input Vin (i), the largest capacitor 32C in the original binary capacitive array is replaced by the first group and the second group, the second largest capacitor 16C is replaced by the third group, the remaining 8C, 4C, 2C, C, and C capacitors are replaced by the capacitors in the fourth group. For the next input Vin (i+1), a different rule is taken to replace the capacitors. A complete period includes six rounds in total.

The reason why the linearity can be improved by this invention lies in the following two aspects.

Figure 6:
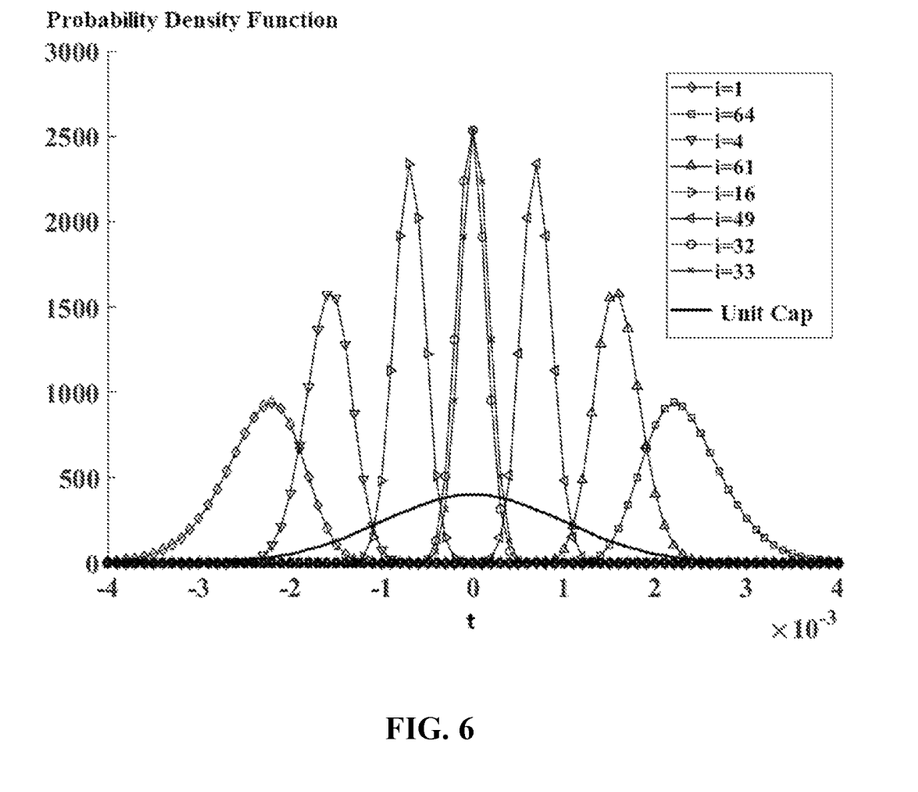
FIG. 6 is a chart of comparison of probability density function between capacitors with and without sorting.

Firstly, according to statistical principles, the standard deviation of the distribution function after sorting is reduced so that the equivalent capacitor mismatch error is reduced, according to the distribution function shown in FIG. 6. In FIG. 6, the distribution function of the sorted capacitor is narrower and higher relative to the unit capacitance (black curve in FIG. 6), which means smaller standard deviation and smaller capacitor mismatch error.

Secondly, the capacitor mismatch error accumulates continuously in a traditional SAR ADC. In order to eliminate the accumulation, the capacitive array optimization technique proposed in this invention sorts the unit capacitors firstly, then divides the unit capacitors into 4 groups, alternates the 4 groups of capacitors in sequence according to six different arrangements. This invention does not need to introduce an extra operational amplifier to conduct noise shaping, does not require any calibration algorithms, and does not require extra capacitors. The accumulated mismatch error is quantified by the variance $\sigma_{INL}^2$ of INL:

$$\sigma_{INL}^2 = \frac{n(N_T - n)}{N_T^3} \sigma_u^2, \tag{1}$$

in which $N_T$ is the total number of capacitors; for N-bit SAR ADC, $N_T=2^N$, n is the number of used components; for the traditional capacitive array, when n is equal to $N_T/2$, there is the formula as follows:

$$\sigma_{INL,max} = \frac{\sigma_u}{\sqrt{2^{N+2}}}, \quad (2)$$

which demonstrates that the maximum error of the traditional SAR ADC occurs at the midpoint, and the maximum integral nonlinearity error is $$\sigma_{INL,max} = \frac{\sigma_u}{\sqrt{2^{N+2}}}.$$

According to this invention, four groups of capacitors rotates in turn, it is assumed that the digital code $n_1$, $n_2$, $n_3$, and $n_4$ represent conversion results for the first, the second, the third, and the fourth conversion, respectively, and the variance for the four times of conversion is: $\sigma_{n1234}^2 = (n_1+n_2+n_3+n_4)\sigma_u^2$.

When $n_{1234}=n_1+n_2+n_3+n_4$, the INL variance is calculated as follows:

$$\sigma_{INL\_group}^2 = \frac{(n_{1234})[N_T - (n_{1234})]}{16N_T^3}\sigma_u^2, \quad (3)$$

in which $N_T$ is the total number of capacitors, $\sigma_u$ is the mismatch error of unit capacitor. When $n_{1234}=N_T/2$, $\sigma_{INL_{group},max}$ is calculated as follows:

$$\sigma_{INL_{group},max} = \frac{\sigma_u}{\sqrt{2^{N+6}}}. \quad (4).$$

Comparing (2) and (4), it demonstrates that the rotation of the four groups of capacitors reduces the integrated nonlinear error to one quarter of that of the traditional SAR ADC, and as well known, the reduction of integrated nonlinear error corresponds to increase of SFDR.

In conclusion, grouping and sorting results in a reduction of the capacitor equivalent mismatch error. The capacitor replacement rule avoids the error accumulation, thus improving the linearity. Therefore, this invention combines the advantages of two methods to achieve a substantial increase in linearity.

Figure 7:
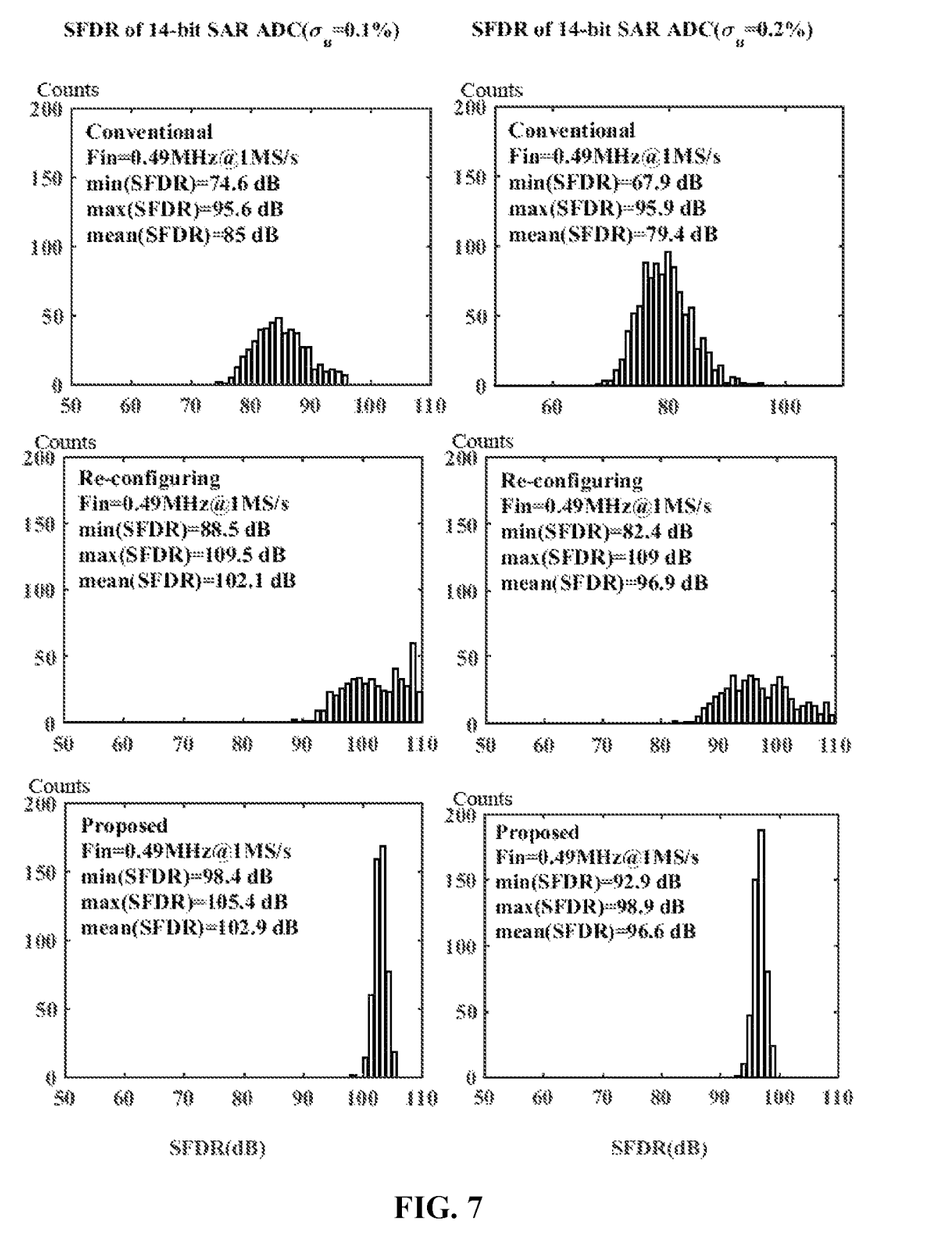
FIG. 7 is 500 Monte Carlo SFDR simulation results for 14-bit SAR ADC in the conventional method, the capacitor re-configuring method, and the method of the invention with $\sigma_u=0.1\%$ (left) and $\sigma_u=0.2\%$ (right)
Figure 8:
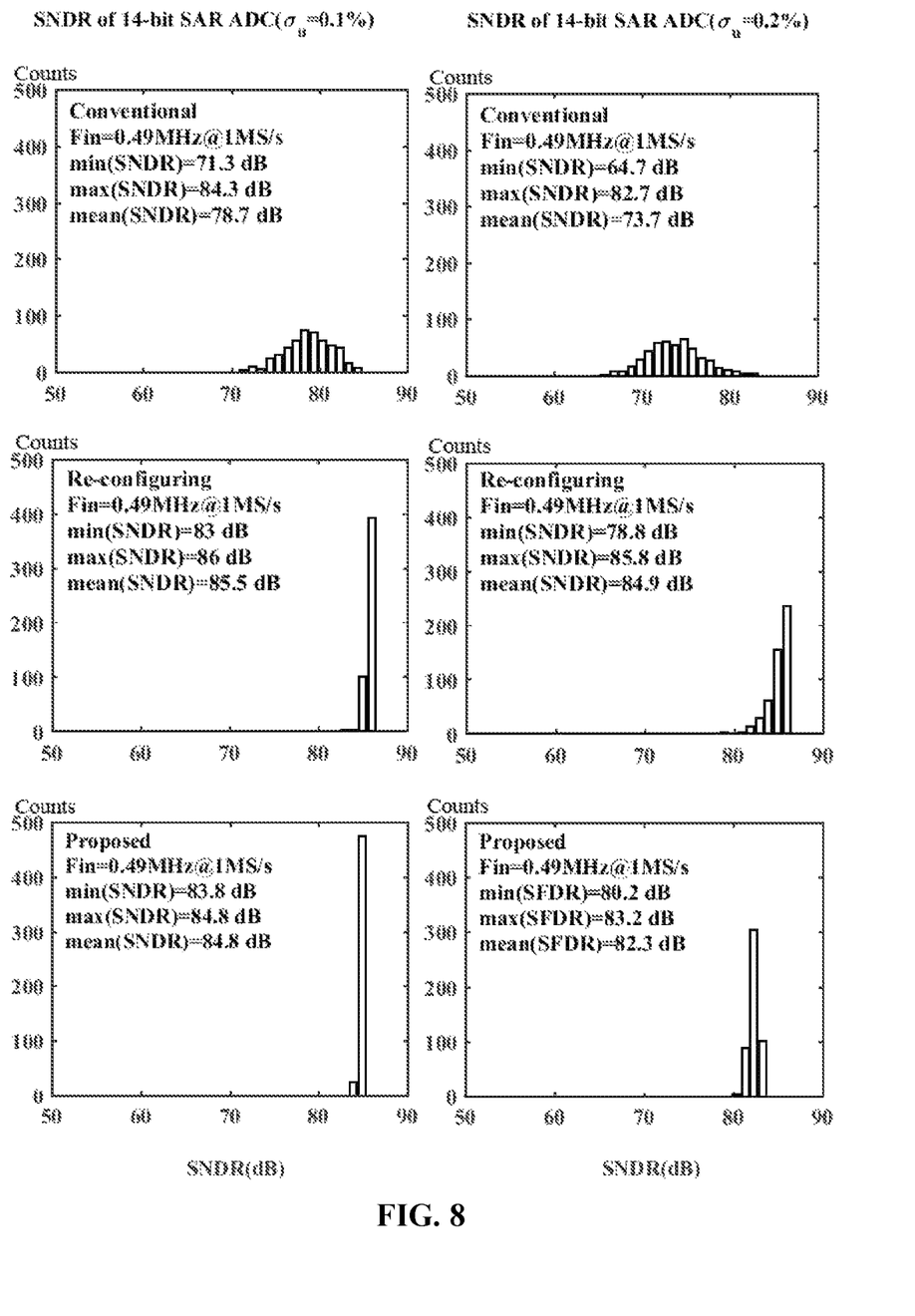
FIG. 8 is 500 Monte Carlo SNDR simulation results for 14-bit SAR ADC in the conventional method, the capacitor re-configuring method, and the method of the invention with $\sigma_u=0.1\%$ (left) and $\sigma_u=0.2\%$ (right).

FIG. 7 and FIG. 8 show the SFDR and SNDR results based on the conventional method, the capacitor re-configuring method proposed in Fan, and the capacitive array optimization technique proposed in this invention for 500 Monte Carlo runs based on 14-bit resistor-capacitor successive approximation ADC. In the simulation, the unit capacitance is 100 f, and the unit capacitance mismatch error $\sigma_u$ is 0.1% and 0.2%, respectively.

Table 1 summarizes the performance comparison among the traditional method, the capacitor re-configuring method proposed in Fan, and the capacitive array optimization technique of this invention. For capacitor re-configuring technique, extra 64 capacitors were added to the capacitive array, and the difference between the maximum value and minimum value of SFDR in the set of values obtained by the Monte Carlo simulation reaches 26.6 dB with $\sigma_u=0.2\%$, the capacitive array optimization technique of this invention makes the SFDR more concentrated in the center, and reduces the difference between maximum value and minimum value of SFDR to only 6 dB with $\sigma_u=0.2\%$, which means more stable performance enhancement. It is worth to mention that the concentration becomes more obvious for the SNDR and SNR results. In a word, the capacitive array optimization technique of this invention achieves excellent performance enhancement without extra capacitors and without sacrificing the sampling rate of conventional SAR ADC.

TABLE 1

Comparison of SFDR between conventional method, the re-configuring techniques of Fan, and the method of the invention in 14-bit ADC

|  | Averaged SFDR (dB) | | Averaged SNDR (dB) | |
| --- | --- | --- | --- | --- |
|  | σ = 0.1% | σ = 0.2% | σ = 0.1% | σ = 0.2% |
| Conventional 14-bit SAR ADC | 85 | 79.4 | 78.7 | 73.7 |
| Re-configuring technique in 14-bit SAR ADC of Fan | 102.1 | 96.9 | 85.5 | 84.9 |
| The method of the invention in 14-bit SAR ADC | 102.9 | 96.6 | 84.8 | 82.3 |

Compared with the conventional resistor-capacitor SAR ADC, this invention improves the average SFDR by about 17.2 dB and the average SNDR by about 8.6 dB with $\sigma_u=0.2\%$. Although the capacitor re-configuring proposed in Fan can also improve SFDR, but an additional 64 extra capacitors are needed. This invention avoids the addition of 64 extra unit capacitors, further reduces the power consumption and silicon area.

In this invention, a novel capacitor array optimization scheme is proposed based on conventional capacitor-resistor SAR ADC. By sorting, grouping, and rotating the capacitive array, the mismatch errors of the ADC can be counteracted. Compared with the traditional noise shaping technology or the Least-Mean-Square (LMS) calibration algorithm, the control logic of this invention is much easier, and the hardware cost is much smaller, reducing the power consumption and the area at the same time. Compared with the capacitor re-configuring method of Fan, this invention avoids the introduction of additional capacitors but achieves the dynamic parameters nearly similar to the capacitor re-configuring method.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method of arranging a capacitor array of a successive approximation register analog-to-digital converter, the method comprising:
   1) separating a 6-bit binary capacitive digital-to-analog converter (DAC) of 64 unit capacitors into 64 independent capacitors;

2) sorting the 64 independent capacitors from highest to lowest by capacitance, then using 64 digital codes from C1 to C64 to number the 64 independent capacitors sorted from highest to lowest by capacitance, and then recording the 64 digital codes and corresponding capacitance values of the 64 independent capacitors in a register;

3) dividing the 64 independent capacitors into four groups as follows:
   i) Group 1 comprising C1, C64, C3, C62, C5, C60, C7, C58, C9, C56, C11, C54, C13, C52, C15, and C50;
   ii) Group 2 comprising C17, C48, C19, C46, C21, C44, C23, C42, C25, C40, C27, C38, C29, C36, C31, and C34;
   iii) Group 3 comprising C32, C33, C30, C35, C28, C37, C26, C39, C24, C41, C22, C43, C20, C45, C18, and C47; and
   iv) Group 4 comprising C16, C49, C14, C51, C12, C53, C10, C55, C8, C57, C6, C59, C4, C61, C2, and C63; and 4) in a successive approximation conversion process, selecting two of the four groups to constitute a largest capacitor 32C, selecting a first of the remaining two of the four groups to constitute a second largest capacitor 16C, selecting 1th-8th capacitors in a second of the remaining two of the four groups to constitute a capacitor 8C, selecting 9th-12th capacitors in the second of the remaining two of the four groups to constitute a capacitor 4C, selecting 13th and 14th capacitors in the second of the remaining two of the four groups to constitute a capacitor 2C, and selecting 15th and 16th capacitors in the second of the remaining two of the four groups to constitute two capacitors C and C, respectively;

wherein 4) comprises six successive approximation conversion processes as follows:

in a first successive approximation conversion process, Group 1 and Group 2 are selected to constitute the largest capacitor 32C, Group 3 is selected to constitute the second largest capacitor 16C, Group 4 is selected to constitute the capacitors 8C, 4C, 2C, C, and C;

in a second successive approximation conversion process, Group 4 and Group 1 are selected to replace the largest capacitor 32C, Group 2 is selected to replace the second largest capacitor 16C, Group 3 is selected to replace the capacitors 8C, 4C, 2C, C, and C;

in a third successive approximation conversion process, Group 3 and Group 4 are selected to replace the largest capacitor 32C, Group 1 is selected to replace the second largest capacitor 16C, Group 2 is selected to replace the capacitors 8C, 4C, 2C, C, and C;

in a fourth successive approximation conversion process, Group 2 and Group 3 are selected to replace the largest capacitor 32C, Group 4 is selected to replace the second largest capacitor 16C, Group 1 is selected to replace the capacitors 8C, 4C, 2C, C, and C;

in a fifth successive approximation conversion process, Group 3 and Group 4 are selected to replace the largest capacitor 32C, Group 1 is selected to replace the second largest capacitor 16C, Group 2 is selected to replace the capacitors 8C, 4C, 2C, C, and C; and in a sixth successive approximation conversion process, Group 4 and Group 1 are selected to replace the largest capacitor 32C, Group 2 is selected to replace the second largest capacitor 16C, Group 3 is selected to replace the capacitors 8C, 4C, 2C, C, and C; and the six successive approximation conversion processes are repeated in loops.

\* \* \* \* \*